United States Patent [19]
Julian

[11] Patent Number: 5,122,806
[45] Date of Patent: Jun. 16, 1992

[54] METHOD FOR FINDING DEFECTIVE ACTIVE ARRAY MODULES USING AN FFT OVER PHASE STATES

[75] Inventor: Michael D. Julian, Playa Del Rey, Calif.

[73] Assignee: Hughes Aircraft Company, Los Angeles, Calif.

[21] Appl. No.: 531,186

[22] Filed: May 31, 1990

[51] Int. Cl.[5] ............................................. G01S 7/40
[52] U.S. Cl. .................................. 342/173; 342/372; 342/174
[58] Field of Search ............... 342/173, 174, 372, 371

[56] References Cited

U.S. PATENT DOCUMENTS

| | | | |
|---|---|---|---|
| 4,488,155 | 12/1984 | Wu | 342/376 |
| 4,622,556 | 11/1986 | Bryant et al. | 342/174 |
| 4,768,035 | 8/1988 | Thurber et al. | 342/194 |
| 4,926,186 | 5/1990 | Kelly et al. | 342/360 |
| 4,940,985 | 7/1990 | Taylor, Jr. et al. | 342/174 |
| 4,947,176 | 8/1990 | Inatsune et al. | 342/173 |

Primary Examiner—John B. Sotomayor
Attorney, Agent, or Firm—Leonard A. Alkov; W. K. Denson-Low

[57] ABSTRACT

All modules of an active antenna array with the exception of a module under test are disabled. Samples representative of the output of the transmit and receive phase shifter outputs of the module under test are taken for successive pairs of transmit/receive modes of operation at the N successive phase increments of the module under test. Fast Fourier transforms (FFTs) are performed over the samples separately for transmit and receive states, and the power in each FFT filter for each state is detected. Power comparison between the power in filter 1 (numbered from 0) and the power in the sum of filters 2 through (N-1) is then used to determine whether the module under test is defective.

19 Claims, 3 Drawing Sheets

METHOD FOR FINDING DEFECTIVE ACTIVE ARRAY MODULES USING AN FFT OVER PHASE STATES

BACKGROUND OF THE INVENTION

1. Field of the Invention

The subject invention relates generally to antennas and, more particularly, to a method for locating failed elements in an active antenna array.

2. Description of Related Art

An assembled active antenna array is complex, typically including thousands of modules, sometimes also referred to as "elements." These modules typically contain a receive path and a transmit path. The receive path typically includes a low noise amplifier outputting to a receive phase shifter whose phase shifted output is combined with that of the receive phase shifters of other modules and supplied to a main receiver and filter. The module's transmit path includes a transmit phase shifter which phase shifts the transmit signal and supplies the phase shifted transmit signal to an output power amplifier.

Each of the modules of an active antenna array thus includes a number of elements and may fail in a variety of ways. It is costly and time-consuming to remove an active array from an aircraft or other carrier in order to replace defective modules. Thus, if some modules do fail after installation, it becomes important to partially compensate for performance degradation without physical replacement.

Studies have shown that the impact of a failed module can be minimized by turning it off. This, of course, implies that such failed modules must be detectable. Evaluating a failed module is complicated by the fact that leakage power from other modules in the array will likely swamp the power of a single active module. Accordingly, there is a need in the art for a method of locating a failed module or element in an active antenna array.

SUMMARY OF THE INVENTION

It is therefore an object of the invention to improve active antenna arrays;

It is another object of the invention to provide a method for locating a failed module or element in an active antenna array; and It is another object of the invention to provide a method for locating a failed module which is effective despite the effects of leakage power from other modules in the array.

According to the invention, a defective module is located by taking advantage of the observation that the leakage power is essentially DC with respect to the setting of the phase shifters of the module. Accordingly, a Fourier transform power spectrum may be examined to detect a bad module. A comparison of filter powers allows an evaluation of module performance, while avoiding problems associated with leakage from adjacent modules.

According to a preferred method, all modules of an active antenna array except the one under test are turned off. The active module is placed in the transmit state with a built-in-test (BIT) horn set to receive. The module under test transmits a pulse, which is received by the BIT horn, and a measurement of a signal representative of the output of the module transmit phase shifter is taken. The BIT horn is then set to transmit with the active module receiving. A measurement of a signal representative of the output of the receive phase shifter of the module is then taken. The transmit and receive phase shifters in the active module are then sequentially rotated to the next phase state. Subsequent transmit and receive measurements are made in the next phase state and each subsequent phase state until all phase states are evaluated. Then, separate fast Fourier transforms (FFTs) are performed, one FFT for each set of measured signals associated with each transmit or receive phase shifter. The filters are then power detected and compared to determine whether module performance is acceptable.

According to another feature of the invention, the just-described procedure may be repeated at a half gain setting of the attenuator of the module under test. This feature permits a partial check of the attenuator performance. It should be observed that methods other than a BIT horn may be used for injecting signals into or receiving signals from the modules without departing from the scope of the invention.

BRIEF DESCRIPTION OF THE DRAWINGS

The just-summarized invention will now be described in more detail in conjunction with the drawings, of which.

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide an efficient and relatively easily implementable technique for finding defective active array modules.

Figure 1:
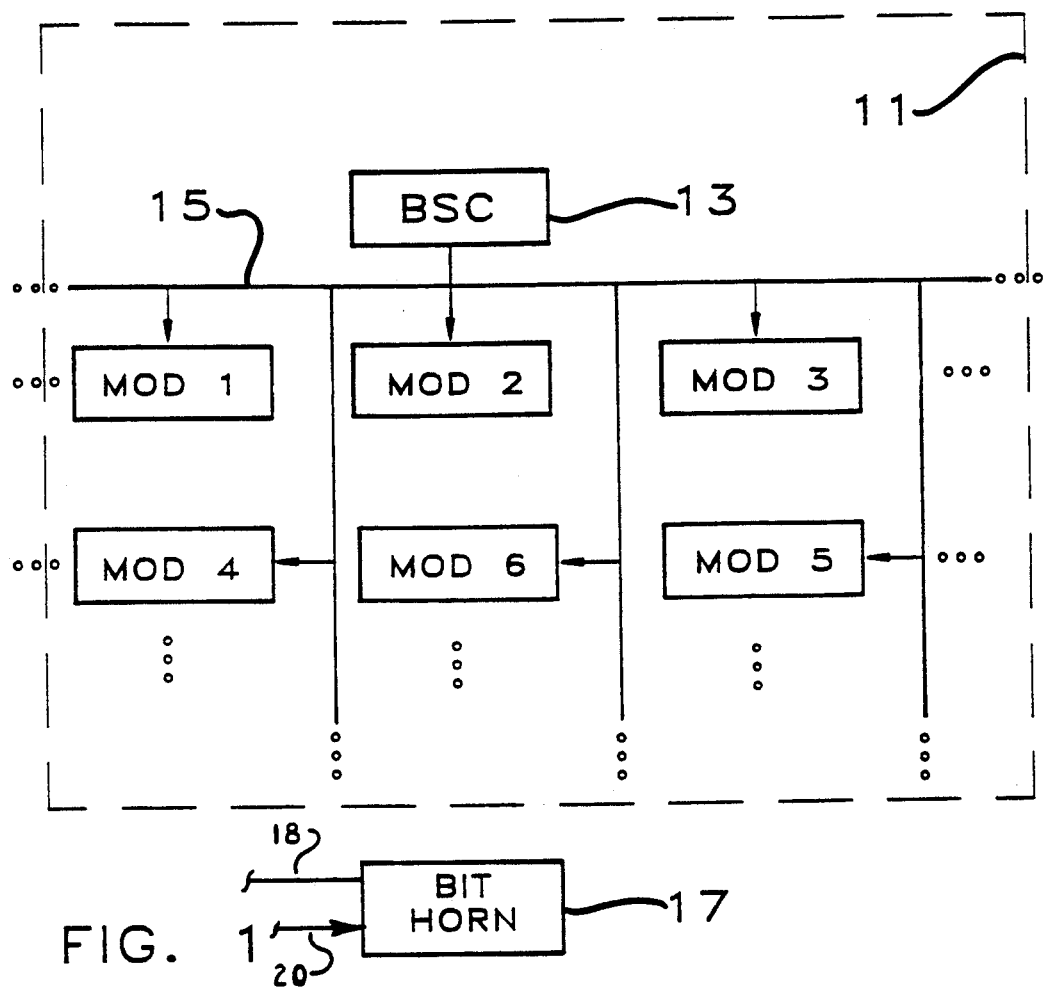
FIG. 1 is a schematic block diagram illustrating an active antenna array including a bit horn according to the preferred embodiment.

FIG. 1 illustrates an active array antenna system 11, which includes a conventional beam steering computer (BSC) 13 and a number of conventional antenna modules or elements MOD1, MOD2, MOD3 . . . , which communicate over a bus system 15. The BSC 13 provides signals to set the transmit and receive phase and gains of the modules MOD1, MOD2, MOD3 . . . . It may also enable or disable the power or low noise amplifiers of the modules MOD1, MOD2, MOD3, . . . . It may turn off a module MOD1, MOD2, MOD3 . . . , select the polarization direction, and send out operational information such as the RF frequency, all as known in the art.

According to the preferred embodiment, a small microwave BIT horn 17 is placed in front of the antenna 11. The BIT horn 17 is a passive probe such as an open, flared pipe capable of transmission and reception. All of he modules except the one under test, referred to hereafter as the "active module," are ten turned off, and an evaluation is made, according to the procedure to be described. The procedure is preferably and readily implemented by control and calculation performed by a programmable signal processor. Typically, such a signal processor is a computer separate from the BSC 13, and which may control the BSC 13 if desired.

Figure 2:
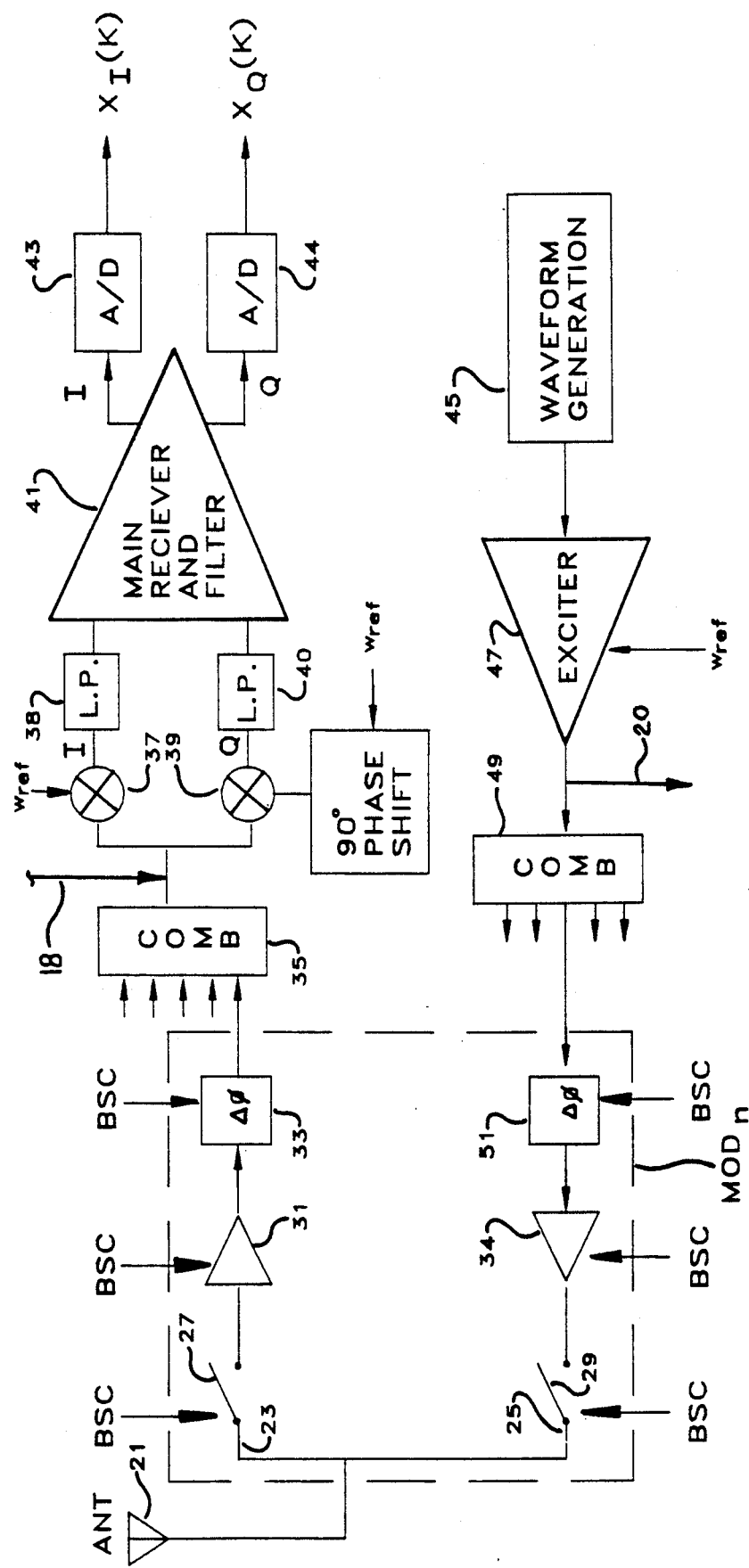
FIG. 2 is a schematic block diagram illustrating the generic structure of the modules of the array of FIG. 1.

FIG. 2 illustrates a typical module MODn of the module array MOD1, MOD2 . . . In this module MODn, an antenna element 21 is connected to both a receive path 23 and a transit path 25. Respective switches 27, 29 are placed int he receive path 23 and transmit path 25 to alternately connect the antenna 21 to either a low noise input amplifier (LNA) 31 or a power output amplifier 34,. As indicted, closing of the switches 27, 29 is under control of the beam steering computer 13, as is the gain of each to the amplifiers 31, 34.

The LNA 31 outputs to a receive phase shifter 33, which supplies a phase shifted output signal or pulse to an analog combining network 35. The amount of phase shift is selected by the BSC 13 and is typically applied through a series of phase increments, numbering, for example, 32. The combining network 35 receives the outputs of each receive phase shifter 33 of all the other modules MOD1, MOD2 . . . and adds the RF analog signals together. The output voltage of the combining network 35 is mixed by respective mixers 37, 39 with a reference oscillator signal at a reference frequency $\omega_{ref}$ and the same signal $\omega_{ref}$ shifted in phase by 90 degrees, thereby forming in-phase and quadrature outputs I, Q. These outputs I, Q are filtered by respective low pass filters 38, 40 and supplied to a main receiver and filter 41 which outputs analog signals to first and second A/D converters 43, 44. Each A/D converter 43, 44 samples its input to produce a succession of IQ samples $X_o(k) = x_I(k) + jx_Q(k)$. Those skilled in the art will appreciate that the digitized signal $x_o(k)$ represents a signal where a relatively nonmoving target in the environment (zero doppler) produces a DC signal.

On the transmit side of the module MODn, the power amplifier 34 is supplied with an input signal generated as follows. A waveform generator 45 generates a waveform which is supplied to an exciter 47. The exciter 47 supplies an RF signal synched to the reference oscillator frequency $\omega_{ref}$ and outputs to a combiner 49. The combiner 49 distributes low level RF energy to all the modules, including a transmit phase shifter 51 of the module MODn and the transmit phase shifters of the other modules MODI, MOD2 . . . . The transmit phase shifter 51 imparts a phase shift selected by the BSC 13 to its input signal and supplies the phase shifted signal to the input of the power amplifier 34.

On transmission, a module MODI, MOD2 . . . takes exciter power, amplifies it, shifts the phase, and then radiates. On receive, the process is reversed. The received energy is amplified, phase shifted, then sent to the receiver 41. Those skilled in the art will appreciate that various configurations of module, receiver, and transmit circuitry may be used according to the invention, aside from that shown in FIG. 2.

According to the preferred embodiment, when the module under test, MODn, is in the transmit mode, the signal radiated by the antenna element 21 is received by the BIT horn 17 and input to the receiver circuitry at input 18, after the combiner 35. When the module under test, MODn, is in the receive mode, the output of the exciter 47 is tapped by line 20 to the BIT horn 17, which then radiates the low level exciter RF energy synched to the master oscillator frequency $\omega_{ref}$ to element 21 of the module under test, MODn, and thence into the receiver 41. Signal lines 18 and 20 are thus switched alternately to the BIT horn 17 by suitable switches in synchronism with the operation of the switches 27, 29.

One of the most severe problems associated with evaluating a single module, e.g., MODn, in an array of modules MOD1, MOD2, MOD3 . . . is that of leakage. Turning off a module such as MOD1 is achieved by turning off its amplifiers 31, 34 in response to control signals from the BSC 13. Even though these amplifiers 31, 34 are turned off, power from the exciter 47 may still leak through the module assembly and be radiated. Similarly, for receive tests, energy radiated at the antenna 21 from the BIT horn 17 may leak through the modules MOD1, MOD2, MOD3 . . . and be received. Thus, a module MOD1 in the off state acts like an attenuator, rather than an open circuit. The leakage power from several thousand leaking modules will likely swamp the power of a single active module MODn, thus making detection of the performance of the active module MODn impossible.

The preferred embodiment provides a procedure for evaluating the performance of an individual module MODn, which overcomes the leakage problem. The problem of leakage is largely eliminated by observing that the composite leakage voltage is at a fixed phase with respect to the exciter or BIT horn voltage. The active module MODn is also at a fixed phase to the leakage power. Thus, if the phase of the module MODn is rotated, its output acts like an AC signal on top of a large DC background of leakage. A Fourier transform can then separate out the module energy.

According to the preferred embodiment, a set of IQ pulses or signals equal to the number of phase shifter states is measured. If the phase of the active module MODn is rotated sequentially between each measurement, its energy is separable from the background. Measurement of the IQ pulses is conveniently done and analyzed according to the embodiment of FIG. 2 by utilizing the digital outputs $x_I(k)$ and $x_Q(k)$.

The scheme according to the preferred embodiment is designed to place the leakage power into filter 0 (the FFT for the first state) and the module power into filter 1 (the FFT for the second state). The other FFT filters may receive power depending on the nonuniformity of phase and amplitude variations as the phase is rotated. If too much power lies in these filters, then the module phase or amplitude accuracy is bad. The procedure is preferably repeated for another gain setting to check attenuator function and accuracy.

As a more detailed example of the scheme according to the preferred embodiment, assume that N, the number of phase shifter states, is the typical 32. The active module MODn then increments its phase by one state at each command or "sync" from the BSC 13. These syncs can be programmed to occur at one-millisecond (ms) intervals. The active module MODn is additionally switched between transmit and receive by appropriate closing of the switches 29, 27 for each phase state. The BIT horn 17 transmits or receives alternately with the active module MODn, as previously described.

This procedure yields 64 IQ samples for a given frequency in 32 ms. Then two 32-point FFTs are taken from the alternate transmit and receive configurations. The FFT taken on the 32 IQ samples from the receiver 41 when the module MODn is in the transmit state and the BIT horn 17 supplies the received signal over line 18 verifies operation of the transmit phase shifter 51 of the module MODn. The FFT taken on the 32 IQ samples from the receiver 41 of the module MODn when the module MODn is in the receive state and the BIT horn 17 radiates the signal received over line 20 verifies operation of the receive phase shifter 33 of the module MODn.

The process is thereafter repeated with the LNA and power amplifiers 31, 33 set to half gain. Thus, each 1000 modules at a given RF frequency require about one minute of total testing. Since the tests are independent from module to module, the entire procedure may be partitioned into short background tasks.

An instructive mathematical analysis of the preferred method can be made based on the following observations, assumptions, and notational definitions. First, one may observe that, if the 32 phase states were precisely separated by the nominal 11.25 degrees, then the rotated phase would produce a perfect sinusoid. Normally, however, there is an RMS phase error, which is hereafter denoted "$\phi$." Also, the amplitude may vary slightly with phase state, and the standard deviation of the amplitude error is hereafter denoted "b." Assume that these phase and amplitude errors are mean zero. Further, it is assumed for simplicity that the phase error is uniformly distributed.

When the FFTs are performed, the phase and amplitude errors cause a filter smearing. The amount of smearing may then be related to module performance. In the statistical averages computed below, the phase and gain averages will be done independently. This follows by taking ensemble averages over all modules.

To begin the analysis, let the IQ samples $x_o(k)$ without error be given by:

$$x_o(k) = A\ exp(2\pi k/N) + L \tag{3-1}$$

Here voltage of the module under test, MODn, and L is the leakage voltage. Both may be complex. Equation 3-1 sets forth the response of a module MODn without error. The corresponding expression x(k) with errors is:

$$x(k) = (a + \Delta A_k)\ exp[2](k + \Delta k)/N] + L \tag{3-2}$$

The $\Delta A_k$ term is the absolute amplitude error of a given radiator for the kth time sample. The phase error term $\Delta k$ for phase shifter k is related to $\phi$, the RMS error in radians, by:

$$\phi^2 = <(2\pi\Delta k/N)^2> \tag{3-3}$$

The angle brackets denote the ensemble average.

In what follows it will be convenient to employ the following abbreviation:

$$W = exp(2\pi j/N) \tag{3-4}$$

A useful relation for W is:

$$\frac{1}{N} \sum_{k=0}^{N-1} W^{km} = \delta_{0m} \tag{3-5}$$

The Fourier transform of the rotated phase states becomes:

$$y(m) = \frac{1}{N} \sum_{k=0}^{N-1} x(k) W^{-km} \tag{3-6}$$

The average power in filter m is thus $<y(m)^2> = P_m$.

Mathematical substitution and simplification yield the following result for Pm, the average power in filter m:

$$P_m \approx |L|^2 \delta_{0m} + |A|^2 \delta_{1m}(1 - \phi^2) + \frac{A^2}{N}\left[\phi^2 + \left|\frac{b}{A}\right|^2\right] \tag{3-18}$$

Equation (3-18) states that the power in filter m is the sum of three possible contributors: leakage power, the desired phase rotation power, and residual power due to imperfections in the phase and gain as the phase is rotated. The leakage is only in filter 0, as expected. The power in filter 1 is mainly the phase rotation term. The third term in Equation (3-18) is the leakage that occurs in all filters due to errors. The RMS phase and amplitude errors $\phi$ and b contribute an average power to each of the N=32 filters.

Figure 3:
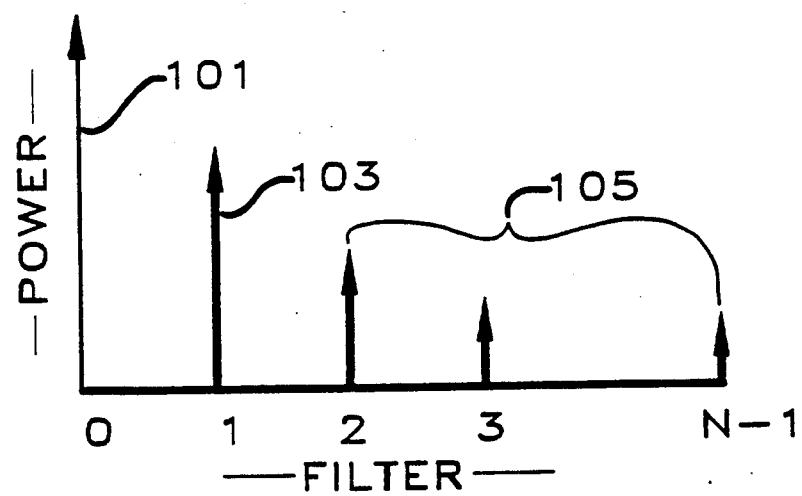
FIG. 3 is a graph illustrating an FFT power spectrum.

The respective powers 101, 103, 105 in filters 0, 1, and the remaining filters is shown graphically in FIG. 3. Spectral component 101 is the leakage power in filter 0. Spectral component 103 is the power from the module or element under test. Spectral component 105 represents power attributable to imperfections.

Based on Equation (3-18), more heuristic, approximate rules, which may prove convenient and useful for evaluating active array modules, are derived. From Equation (3-18) for m>1:

$$[N\ P_m]/P_1 \approx \phi^2 + |b/A|^2 \tag{3-19}$$

Thus, since $N\ P(m) \approx \Sigma P(m)$ for m>i, the ratio of the powers in filters 2-31 to the power in filter 1 is approximately the combined amplitude and phase variance. Additionally, for the phase only error case, the effective sidelobe error SL is approximately given as:

$$SL \approx \phi^2/\#elements \tag{3-20}$$

A very bad sidelobe level is $-45$ db with 3000 elements. This implies $\phi^2 \approx .1$. This leads to the following rule for module quality:

Rule 1. If the sum of powers in filters 2-31 is greater than 10% of that in filter 1, then consider the module defective.

If there were only fractional amplitude error with variance $d^2$, then the resulting SL would be:

$$SL \approx d^2/\ \#elements \tag{3-21}$$

The same reasoning indicates that $d^2 \approx .1$ for the bad case of $-45$ db sidelobes. Since d is the fractional amplitude error, the amplitude is $(1+d)$ times the correct value. The power goes as $(1+d)^2$, which implies that for a nominal power in filter 1 of 0.5, these amplitude errors could lead to values between 0.87 and, 0.29. This provides justification for a second heuristic rule:

Rule 2. If the power in filter 1 with half gain is less than 0.3 of the full gain value or greater than 0.8 of the full value, then consider the filter defective. The half gain setting allows a partial check on the attenuator control.

These heuristic thresholds have not been rigorously justified. A set of detailed measurements of actual elements will allow numerical refinement of the simple rules 1 and 2 tailored for particular systems.

Figure 4:
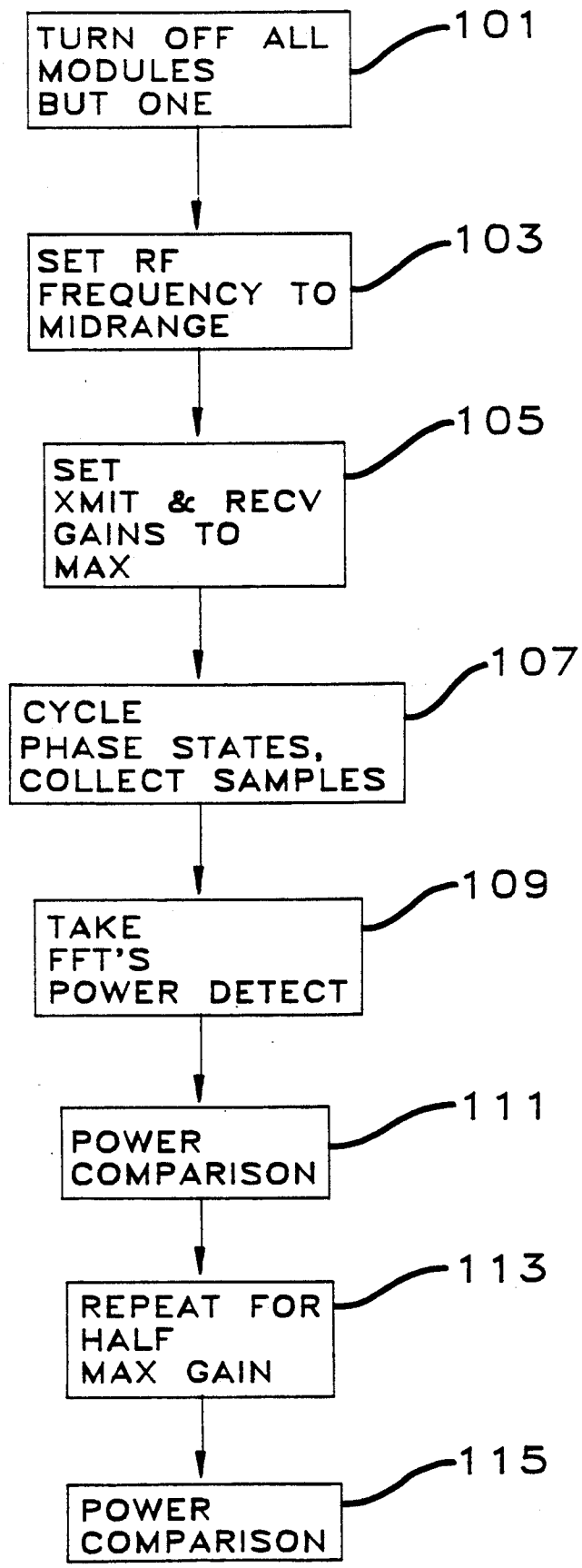
FIG. 4 is a flow chart illustrating the method of the preferred embodiment.

From the foregoing analysis, the following preferred procedure for module testing is illustrated in FIG. 4 and summarized as follows:

(1) turn off all modules but the one under test, step 101.

(2) Set the RF frequency to a mid-range value, step 103.

(3) Set the transmit and receive gains to max, step 105.

(4) Cycle the module through all phase states sequentially for both transmit and receive (N phase states are assumed), step 107.

(5) Collect one IQ sample pulse for each case in step (4), step 107. The samples collected are thus:

$$[x_R(0), x_T(0), x_R(1), x_T(1), \ldots, x_R(N\text{-}1), x_T(N\text{-}1)]$$

(6) Take an FFT over the IQ sample set of transmit samples $\{x_T(k)\}$ and an FFT over the IQ sample set of received samples $\{x_R(k)\}$ and power detect, step 109. The filters are numbered (N-1) for each sample set $\{x_R(k)\}$ and $\{x_T(k)\}$.

(7) Perform a power comparison for each of the two sets of IQ samples, step 111: if the sum of powers in filters 2 through (N-1) is greater than 10% of that in filter 1 for either FFT, then reject the module.

(8) Set the transmit and receive gains to half maximum, then repeat steps 4-7, step 113.

(9) Perform a power comparison, step 115: compare filter 1 powers for the full and half gain cases for transmit and receive separately. If the half gain power is greater than 0.8 of the full gain, then reject the module. If the half gain power is less than 0.3 of the full gain, then reject the module.

In the foregoing, it will be appreciated that steps (1) to (5) and (8) are accomplished in a straightforward manner through program control of various module elements of FIG. 2 by the BSC 13 or similar processor. The processing is then done in a programmable signal processor which performs the computations, detection, and comparisons required by steps (6), (7), and (9), according to the equations set forth above. The tests set forth in the above procedure are by no means exhaustive, but are designed to easily pick up gross malfunctions. The crux of the method is the fact that leakage is essentially DC with respect to the settings of the phase shifters 33, 51.

It may be observed that the number of incremented phase states need not be N. For instance, if every other state is cycled through, then there are only N/2 FFT filters to consider. The leakage in this case is still in filter 0. The module signal is still in filter 1. The calibration time is then cut in half. However, this shorter method is not a thorough test of the module.

As the number of phase increments is reduced, the thresholds for rejection may vary. Also, the ratio of energies between filter 1 and the sum of the others may be less reliable. The trade-off between accuracy and time can best be gauged by measurements of any particular implementation.

Those skilled in the art will appreciate that various adaptations and modifications of the justdescribed preferred embodiment can be made without departing from the scope and spirit of the invention. Therefore, it is to be understood that, within the scope of the appended claims, the invention may be practiced other than as specifically described herein.

What is claimed is:

1. A method for evaluating performance of a module of an active antenna array, said array comprising a plurality of modules, said method comprising the steps of:
   turning off al modules of said array but the one module under test;
   determining a fast fourier transform (FFT) power spectrum over the phase states, including a power component related to said module under test and a plurality of additional power components; and
   comparing selected said components to evaluate the performance of said module under test.

2. The method of claim 1 wherein an FFT power spectrum is determined for both transmit and receive states of the module.

3. The method of claim 2 wherein said component related to the module under test is compared to the sum of the power of said plurality of additional components.

4. The method of claim 1 wherein said spectrum further includes a leakage power component.

5. The method of claim 4 wherein an FFT power spectrum is determined for both transmit and receive states of the module.

6. The method of claim 5 wherein said component related to the module under test is compared to the sum of the power of said plurality of additional components.

7. In an active antenna array comprising a plurality of array modules, each module including a transmit phase shifter and a receive phase shifter, a method of detecting a failed module of the array comprising the steps of:
   turning off all modules of the array but one, said one module comprising a module under test;
   cycling said module under test through alternating receive and transmit states;
   shifting the phase of the module under test after each successive pair of receive and transmit states;
   sampling first and second signals, the first signal being representative of the transmit phase shifter output, the second signal being representative of the receive phase shifter output, said first signal being sampled during each transmit state, said second signal being sampled during each receive state;
   collecting the output samples taken in the receive state into a first set and those taken in the transmit state into a second set;
   determining the average power in a succession of Fourier transform filters taken over the samples of said first set;
   determining the average power in a succession of Fourier transform filters taken over the samples of said second set; and
   comparing the power in selected said filters and rejecting the module under test as failed based upon said comparison.

8. The method of claim 7 wherein said samples comprise the output of a receiver supplied with in-phase and quadrature-phase signals and wherein one output sample is collected for each phase state through which the module under test is shifted for both the transmit and receive states.

9. The method of claim 8 wherein said step of determining the average power in each first set of samples includes the step of taking fast Fourier transforms (FFTs) over the samples of said first set.

10. The method of claim 9 wherein said step of taking FFTs includes the step of identifying the power in a plurality of FFT filters and the step of comparing the power in a selected FFT filter to the sum of the powers in a set of the remaining FFT filters.

11. The method of claim 10 wherein the FFT filters are numbered 0 through (N-1) and wherein filter 1 is compared to filters 2 through (N-1).

12. The method of claim 7 wherein said module includes adjustable transmit and receive gains and wherein said method further includes the step of reducing the transmit and receive gains and repeating said sampling, collecting, determining, and comparing steps.

13. The method of claim 12 wherein the transmit and receive gains are set initially to maximum gain and are then reset to half gain when said sampling, collecting, determining, and comparing steps are repeated.

14. The method of claim 7 wherein said module under test transmits and receives at an RF frequency and wherein the RF frequency is set to a midrange value.

15. The method of claim 10 wherein said module under test transmits and receives at an RF frequency and wherein the RF frequency is set to a midrange value.

16. The method of claim 13 wherein said module under test transmits and receives at an RF frequency and wherein the RF frequency is set to a midrange value.

17. The method of claim 11 wherein, if said sum is 10% greater than the power in said selected filter 1, said module is considered defective.

18. The method of claim 10 wherein, if said sum is 10% greater than the power in said selected filter, said module is considered defective.

19. The method of claim 18 wherein, if the half gain power of the module under test is greater than 0.8 or less than 0.3 of full gain power of the module under test, said module under test is considered defective.

* * * * *

UNITED STATES PATENT AND TRADEMARK OFFICE
CERTIFICATE OF CORRECTION

PATENT NO.  : 5,122,806
DATED       : June 16, 1992
INVENTOR(S) : Michael D. Julian It is certified that error appears in the above-indentified patent and that said Letters Patent is hereby corrected as shown below:

Column 1, after the title and before the heading "BACKGROUND OF THE INVENTION," insert the paragraph --This invention was made with Government support under Contract No. G3590-KC1D awarded by the Government. The Government has certain rights in this invention.--

Column 3, line 14, after "output amplifier 34" delete the comma (",").

Column 3, line 14, delete "indicted" and insert therefor --indicated--.

Column 3, line 16, delete "to" and insert therefor --of--.

Column 5, line 35, after "2π" insert -- j --.

Column 5, line 37, after "Here" insert --A is the--.

Column 5, line 42, after "2" delete the right-handed bracket ("]") and insert therefor --πj--.

Column 5, line 68, after "<" and before the "2" insert vertical lines -- | --.

Signed and Sealed this

Fourteenth Day of February, 1995

Attest:

BRUCE LEHMAN

*Attesting Officer*        *Commissioner of Patents and Trademarks*